(12) United States Patent
Vashchenko et al.

(10) Patent No.: US 6,492,859 B2
(45) Date of Patent: Dec. 10, 2002

(54) ADJUSTABLE ELECTROSTATIC DISCHARGE PROTECTION CLAMP

(75) Inventors: Vladislav Vashchenko, Fremont; Peter J. Hopper, San Jose, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 37 days.

(21) Appl. No.: 09/769,084

(22) Filed: Jan. 24, 2001

(65) Prior Publication Data
US 2002/0097082 A1 Jul. 25, 2002

(51) Int. Cl.[7] .............................. H03K 5/08; H03L 5/00
(52) U.S. Cl. .................... 327/310; 361/91.1; 361/111
(58) Field of Search .................... 327/309, 310, 327/311, 312, 313, 314; 361/90, 91.5, 91.6, 111, 91.1

(56) References Cited

U.S. PATENT DOCUMENTS 5,978,192 A * 11/1999 Young et al. .................. 361/56
6,028,758 A * 2/2000 Sharpe-Geisler ............ 361/111
6,268,990 B1 * 7/2001 Ogura et al. ................ 361/91.7

* cited by examiner

Primary Examiner—Terry D. Cunningham
Assistant Examiner—Quan Tra
(74) Attorney, Agent, or Firm—Jurgen Vollrath

(57) ABSTRACT

In an ESD protection circuit for an analog bipolar circuit, the avalanche breakdown voltage of a reverse-coupled NPN BJT acting as an avalanche diode is adjusted to comply with breakdown voltage and latchup requirements by including a resistor between the base and collector of the BJT.

11 Claims, 3 Drawing Sheets

ADJUSTABLE ELECTROSTATIC DISCHARGE PROTECTION CLAMP

FIELD OF THE INVENTION

The invention relates to protection circuitry for protecting circuits against transients such as electrostatic discharge (ESD). In particular, the invention relates to circuitry for protecting analog bipolar circuits, including BJT and BIC-MOS based circuits against voltage transients.

BACKGROUND OF THE INVENTION

Analog circuits typically display sensitivity to excessive voltage levels. Transients, such as ESD can cause the voltage handling capabilities of the analog circuit to be exceeded, resulting in damage to the analog circuit. Clamps have been devised to shunt current to ground during excessive voltage peaks.

Typical protection clamps employ avalanche diodes such as zener diodes 50 to provide the bias voltage for the base of a subsequent power bipolar junction transistor (BJT) 52 as shown in FIG. 5. Since separate, stable avalanche diodes in a given technology are difficult to realize, zener diodes are typically implemented as punch-through, or reverse coupled BJT's, as shown in FIG. 6. FIG. 6 shows a prior art clamp comprising a reverse coupled BJT 600 that acts as an avalanche diode. The BJT 600 has a defined reverse breakdown. A voltage pulse supplied to the input 602 that exceeds the breakdown voltage of the BJT 600, causes an avalanche effect in BJT 600 and results in current flow from the emitter 604 to the collector 606 when the reverse breakdown voltage of the BJT 600 is exceeded. The current drives the base 608 of the power BJT 610 and switches BJT 610 on by raising the voltage across the resistor 612, thus biasing the base 608 to switch on BJT 610. Once the BJT 610 switches on, collector/emitter current is shunted to ground. To reach a higher protection voltage, several zener diodes or reverse coupled BJT's may be connected in series. For example, in a five volt power supply circuit where the BJT 610 is a 10 volt BJT, two 3.5 volt zener diodes could be used to replace BJT 600. Until the BJT 610 switches on, the voltage 602 across the clamp, which is also the voltage applied to the protected circuit, continues to increase during a voltage peak such as a human body discharge. Such a discharge may typically be 120–125% percent of the final holding voltage.

One of the difficulties encountered in designing such protection circuitry is that the specifications for these clamps have to fit within a relatively small design window that takes into account the breakdown voltage of the circuit being protected. Thus, the clamp must be designed so as to be activated below the breakdown voltage of the circuit that is to be protected. At the same time, the design window is limited by the latchup phenomenon. To ensure that the clamp is not conducting under normal operating conditions, the latchup voltage must exceed the normal operating voltage of the protected circuit.

Since the breakdown voltage of a particular punch-through structure in the BJT clamp is determined by the particular technology process, prior art devices have difficulty complying with the small ESD protection window especially for high-voltage circuits, where maximum breakdown voltage can be only 10% higher than the operating voltage.

SUMMARY OF THE INVENTION

The present invention provides a protection clamp against transient conditions, that provides an adjustable ESD protection window. The invention uses the ability of a reverse coupled BJT to provide different breakdown voltage characteristics at different base current multiplication conditions. Base current multiplication is controlled by providing a resistor between the collector and the base of the reverse-coupled BJT.

According to the invention, there is provided an overvoltage protection circuit for protecting an input of an analog bipolar circuit comprising a first bipolar junction transistor having a base, a collector, and at least one emitter, connected between an input of the analog bipolar circuit and ground, a reverse-coupled bipolar junction transistor having a base, a collector, and at least one emitter, wherein the emitter is connected to the input, and the collector is connected to the base of the first bipolar junction transistor, and a resistor connected between the base and the collector of the reverse coupled bipolar junction transistor. The resistor is connected to the reverse-coupled transistor so as to increase base current multiplication in the reverse-coupled transistor.

Further, according to the invention, there is provided a method of improving an overvoltage protection circuit for an input to a protected circuit, wherein the overvoltage protection circuit includes a first transistor for shunting current to ground, and a reverse-coupled transistor connected to the first transistor to switch on the first transistor, the method comprising the step of lowering the reverse-breakdown voltage of the reverse-coupled transistor when a voltage transient occurs by increasing base current multiplication.

DETAILED DESCRIPTION OF THE INVENTION

Figure 1:
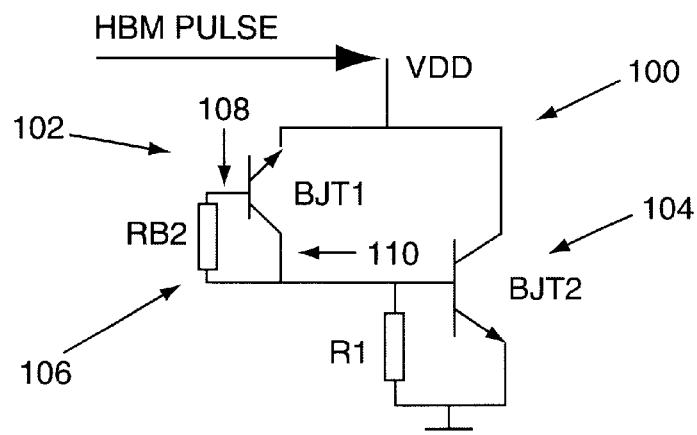
FIG. 1 is a schematic circuit diagram of one embodiment of a clamp of the present invention.

One embodiment of a protection clamp of the invention is shown in FIG. 1. The clamp 100 comprises an avalanche diode in the form of a reverse-coupled NPN BJT 102, and a power BJT 104. It will be appreciated that the reverse-coupled and power transistors could, instead, be PNP transistors. A resistor 106 is connected between the base 108 and collector 110 of the BJT 102.

Figure 2:
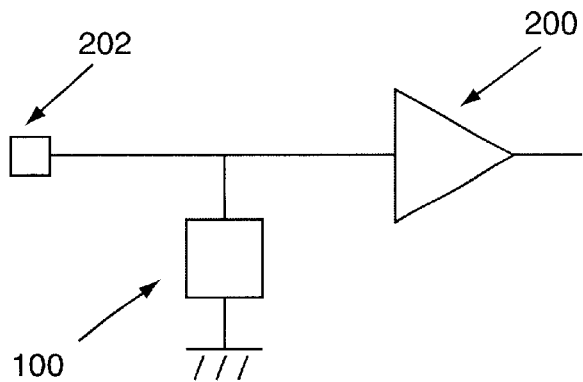
FIG. 2 is a schematic circuit diagram of a general application of the clamp of FIG. 1.

A general implementation of the clamp 100 of the invention is shown in FIG. 2. A general bipolar analog circuit to be protected is represented by amplifier 200 which is attached to a contact pad 202. The clamp 100 is connected in parallel between the input of the circuit 200 and ground.

Figure 3:
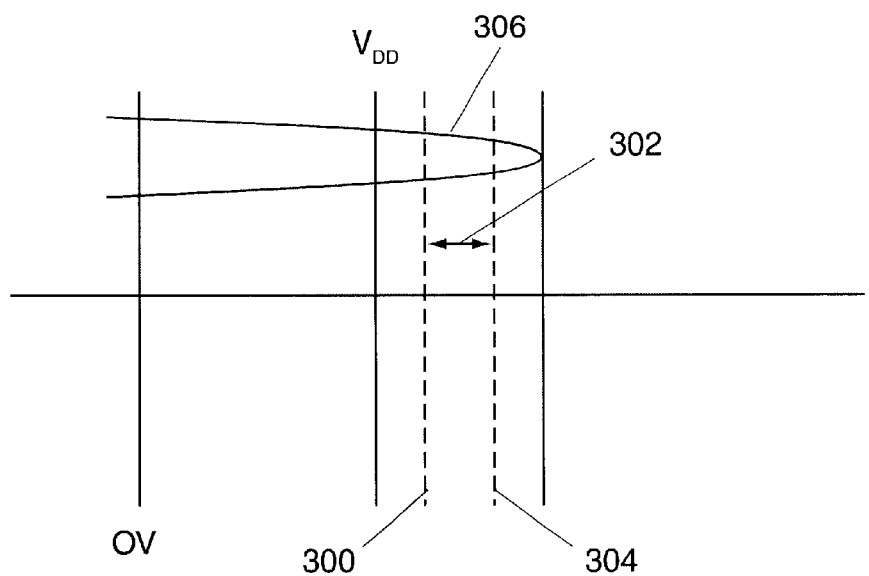
FIG. 3 is a graphical representation showing the operating window of the clamp of the invention.

It will be appreciated, that for the clamp 100 to work effectively it has to turn on before the breakdown voltage of the circuit 200 is exceeded. Furthermore, a typical circuit such as that represented by circuit 200 will have some typical operating voltage, such as 5 V, 12 V, 20 V, etc. To avoid the clamp 100 switching on under stable operating conditions, it will be appreciated that the clamp 100 must be designed to switch on only once the stable operating voltage is exceeded by some defined amount. Under stable operating conditions, the voltage to which the clamp is exposed comprises a DC bias and a signal applied to the protected circuit. The avalanche diode, in this case BJT 102, can handle only brief overvoltage pulses and would typically suffer damage if it remained in conduction under normal operating conditions. Thus the clamp 100 must be designed to switch off at a voltage above the stable operating voltage. This switching voltage, known as latchup is best illustrated by the line 300 in FIG. 3, where the latchup voltage is shown to be somewhat greater than the stable operating voltage $V_{dd}$ of the analog circuit. On the other hand, in order to protect the attached circuit against voltage transients, the clamp must turn on before the breakdown voltage of the attached circuit. The clamp 100 thus has a voltage window 302, between the latchup voltage 300 and the analog circuit breakdown voltage 304 or overvoltage limit, which defines the operating range of the clamp 100. A transient input voltage peak 306, would typically exceed the overvoltage limit 304. However, the clamp 100 serves to protect the analog circuit against this overvoltage peak by switching on and remaining in conduction until the input voltage returns to a level below the latchup voltage 300. It will be appreciated by those skilled in the art that the power BJT 104 could instead be a field effect transistor.

Figure 4:
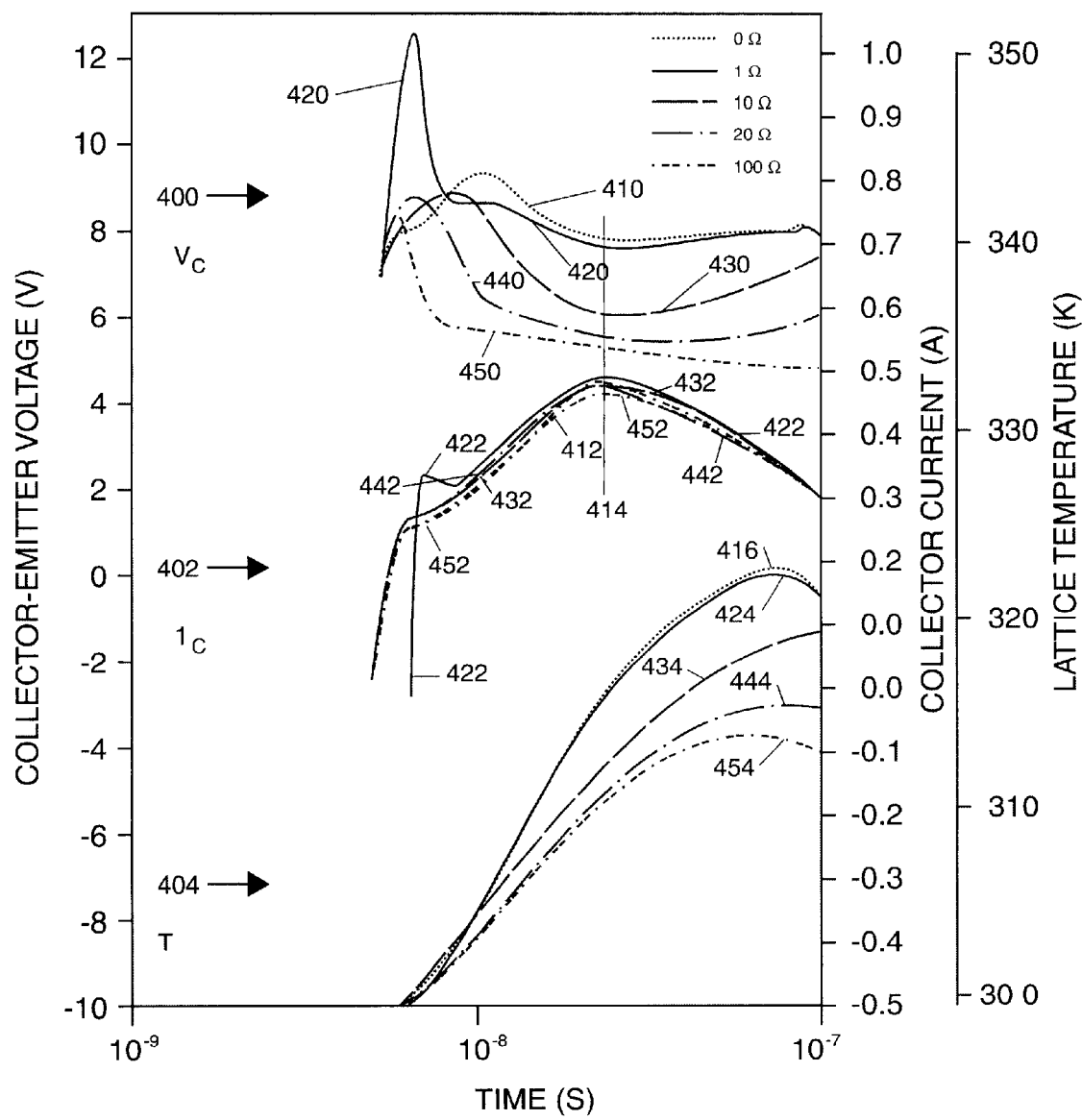
FIG. 4 shows sets of waveforms for the voltage, current, and lattice temperature for various base-collector resistances for the reverse-coupled BJT used in the invention.
Figure 5:
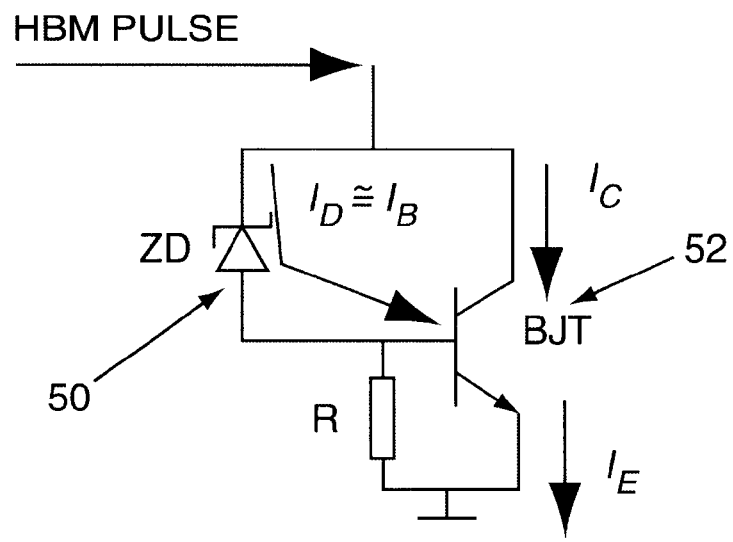
FIG. 5 is a schematic circuit diagram of a prior art clamp.
Figure 6:
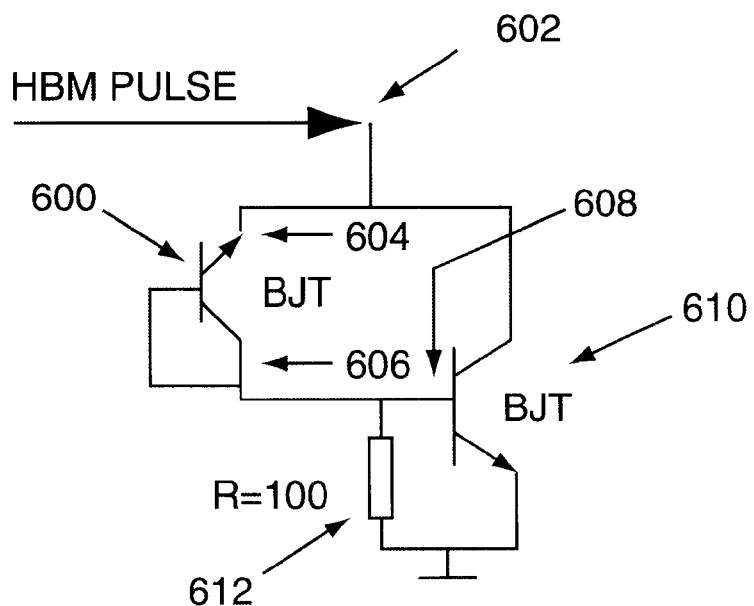
FIG. 6 is a schematic circuit diagram of another prior art clamp.

FIG. 4 shows five sets of waveforms for the collector-emitter voltage of the reverse-coupled BJT, indicated generally by reference numeral 400. Waveforms for the corresponding collector currents of the reverse-coupled BJT 102 are indicated generally by reference numeral 402. Waveforms for the corresponding lattice temperatures of the reverse-coupled BJT 102 are indicated generally by reference numeral 404. The waveforms 400, 402, 404 show the effects of different resistor values for the resistor 106. When a zero resistance is chosen for resistor 106 (short circuit), a collector-emitter voltage 410 is produced having a peak breakdown voltage of about 9V. The corresponding current waveform 412 shows the collector current flow for BJT 104 increasing until the voltage drops to just below 8V thereby defining a very narrow window for protecting circuits with a breakdown voltage of more than 9V and having a latchup voltage of about 8V. The corresponding lattice temperature is shown by waveform 416.

As the resistance of resistor 106 is increased, the breakdown voltage gradually decreases, as does the latchup voltage. This is shown for a resistance of 1 Ω by a voltage waveform 420 and corresponding current waveform 422. The lattice temperature is indicated by waveform 424. Waveform 430 shows the voltage characteristics for a resistance of 10 Ω for the resistor 106. Waveforms 432 and 434 show the corresponding collector-current waveform and lattice-temperature waveform for the 10 Ω resistor embodiment. When the resistance of resistor 106 is increased to 20 Ω, the voltage drops even further as shown by waveform 440. The corresponding current waveform is indicated by reference numeral 442, while the lattice temperature is indicated by waveform 444. Voltage waveform 450 shows the voltage characteristics at a resistance of 100 Ω for resistor 106. The corresponding current waveform is indicated by reference numeral 452, and the corresponding lattice temperature is given by the waveform 454.

The invention has been described with reference to a specific embodiment of a clamp. It will be appreciated that the manipulation of the design window through the inclusion of a resistor to inject current into the base of a reverse-coupled BJT can equally well be applied to variations of the clamp circuit.

What is claimed is:

1. An overvoltage protection circuit for protecting an input of an analog bipolar circuit comprising
    a first bipolar junction transistor having a base, a collector, and at least one emitter, connected between an input of the analog bipolar circuit and ground,
    a reverse-coupled bipolar junction transistor having a base, a collector, and at least one emitter, wherein the emitter is connected to the input, and the collector is connected to the base of the first bipolar junction transistor, and
    a resistor connected between the base and the collector of the reverse coupled bipolar junction transistor.

2. An overvoltage protection circuit comprising
    a first transistor connected as a switch for shunting current to ground,
    a reverse-coupled transistor connected to the first transistor for switching on the first transistor when the reverse breakdown voltage of the reverse-coupled transistor is exceeded, and
    a resistor connected to the reverse-coupled transistor for increasing base current multiplication in the reverse-coupled transistor.

3. An overvoltage protection circuit of claim 2, wherein the first transistor is an NPN bipolar junction transistor.

4. An overvoltage protection circuit of claim 2, wherein the reverse-coupled transistor is an NPN bipolar junction transistor.

5. An overvoltage protection circuit, comprising
    a first transistor for shunting current to ground,
    a reverse-coupled transistor connected to the first transistor to force the first transistor into conduction when the reverse-coupled transistor is forced into conduction, and
    a resistor connected to the reverse-coupled transistor to adjust the breakdown voltage of the reverse-coupled transistor.

6. An overvoltage protection circuit of claim 5, wherein the resistor reduces the break-down voltage of the reverse-coupled transistor by increasing base current multiplication in the reverse-coupled transistor.

7. An overvoltage protection circuit of claim 5, wherein the first transistor is a bipolar junction transistor.

8. An overvoltage protection circuit of claim 5, wherein the first transistor is a field effect transistor.

9. A method of improving an overvoltage protection circuit for an input to a protected circuit, wherein the overvoltage protection circuit includes a first transistor for shunting current to ground, and a reverse-coupled transistor connected to the first transistor to switch on the first transistor, comprising the step of lowering the reverse-breakdown voltage of the reverse-coupled transistor when a voltage transient occurs by increasing base current multiplication.

10. A method of claim 9, wherein the reverse-coupled. transistor is a bipolar junction transistor having a base, a collector and an emitter, and the step of lowering the reverse-breakdown voltage includes injecting current into the base of the bipolar junction transistor.

11. A method of claim 10, wherein the current is injected into the base by connecting a resistor between the base and the collector.

* * * * *